(12) United States Patent
Kobayashi

(10) Patent No.: US 8,451,059 B1
(45) Date of Patent: May 28, 2013

(54) CAPACITIVELY-COUPLED DISTRIBUTED AMPLIFIER WITH BASEBAND PERFORMANCE

(75) Inventor: Kevin W. Kobayashi, Torrance, CA (US)

(73) Assignee: RF Micro Devices, Inc., Greensboro, NC (US)

( * ) Notice: Subject to any disclaimer, the term of this patent is extended or adjusted under 35 U.S.C. 154(b) by 0 days.

(21) Appl. No.: 13/154,910

(22) Filed: Jun. 7, 2011

Related U.S. Application Data

(63) Continuation of application No. 12/651,717, filed on Jan. 4, 2010, now Pat. No. 8,035,449.

(60) Provisional application No. 61/142,283, filed on Jan. 2, 2009.

(51) Int. Cl.
*H03F 3/60* (2006.01)
(52) U.S. Cl.
USPC .............................................. 330/286; 330/54
(58) Field of Classification Search
USPC ..................... 330/53, 54, 124 R, 286, 295
See application file for complete search history.

(56) References Cited

U.S. PATENT DOCUMENTS

| | | | |
|---|---|---|---|
| 3,184,383 A | 5/1965 | Hupin | |
| 4,540,954 A | 9/1985 | Apel | |
| 4,543,535 A * | 9/1985 | Ayasli | 330/53 |
| 4,752,746 A | 6/1988 | Niclas | |
| 4,788,511 A * | 11/1988 | Schindler | 330/277 |
| 5,028,879 A | 7/1991 | Kim | |
| 5,046,155 A * | 9/1991 | Beyer et al. | 330/54 |
| 5,208,547 A | 5/1993 | Schindler | |
| 5,227,734 A | 7/1993 | Schindler et al. | |
| 5,361,038 A | 11/1994 | Allen et al. | |
| 5,365,197 A | 11/1994 | Ikalainen | |
| 5,378,999 A | 1/1995 | Martens et al. | |
| 5,414,387 A * | 5/1995 | Nakahara et al. | 330/286 |
| 5,485,118 A | 1/1996 | Chick | |
| 5,880,640 A | 3/1999 | Dueme | |
| 6,049,250 A | 4/2000 | Kintis et al. | |
| 6,342,815 B1 | 1/2002 | Kobayashi | |
| 6,377,125 B1 | 4/2002 | Pavio et al. | |
| 6,400,226 B2 | 6/2002 | Sato | |
| 6,727,762 B1 | 4/2004 | Kobayashi | |
| 6,759,907 B2 * | 7/2004 | Orr et al. | 330/286 |

(Continued)

OTHER PUBLICATIONS

Ayasli, Yalcin et al., "Capacitively Coupled Traveling-Wave Power Amplifier," IEEE Transactions on Electron Devices, Dec. 1984, pp. 1937-1942, vol. ED-31, No. 12, IEEE.

(Continued)

*Primary Examiner* — Khanh V Nguyen
(74) *Attorney, Agent, or Firm* — Withrow & Terranova, P.L.L.C.

(57) ABSTRACT

The present disclosure relates to a capacitively-coupled distributed amplifier (DA) having an input line and an output line that are coupled to one another through a broadband interface network and DA segments. The input line receives an input signal and the output line provides an output signal based on amplifying the input signal. The broadband interface network includes a group of capacitive elements coupled between the input line and the DA segments to extend a gain-bandwidth product of the DA. The broadband interface network further includes a resistor divider network coupled between the input line and the DA segments to extend a lower end of an operating bandwidth of the DA. As such, the operating bandwidth of the DA may extend from baseband frequencies to microwave frequencies.

13 Claims, 12 Drawing Sheets

U.S. PATENT DOCUMENTS

| | | | |
|---|---|---|---|
| 6,943,631 | B2 | 9/2005 | Scherrer et al. |
| 7,482,874 | B2 * | 1/2009 | Heydari et al. ............... 330/286 |
| 7,804,262 | B2 | 9/2010 | Schuster et al. |
| 7,924,097 | B2 * | 4/2011 | Lender et al. ................ 330/286 |
| 2003/0184383 | A1 | 10/2003 | Ogawa |

OTHER PUBLICATIONS

Ayasli, Yalcin et al., "Monolithic 2-20 GHz GaAs Travelling-Wave Amplifier," Electronic Letters, Jul. 8, 1982, pp. 596-598, vol. 18, IEEE.

Ayasli, Yalcin et al., "Monolithic GaAs Travelling-Wave Amplifier," Electronic Letters, Jun. 11, 1981, pp. 413-414, vol. 17, No. 12, IEEE.

Ayasli, Yalcin et al., "A Monolithic GaAs 1-13-GHz Traveling-Wave Amplifier," IEEE Transactions on Electron Devices, Jul. 1982, pp. 1072-177, vol. 29, No. 7, IEEE.

Ayasli, Yalcin et al., "2-20-GHz GaAs Traveling-Wave Power Amplifier," IEEE Transactions on Microwave Theory and Techniques, Mar. 1984, pp. 290-295, IEEE.

Ayasli, Yalcin et al., "2-20-GHz GaAs Traveling-Wave Amplifier," IEEE Transactions on Microwave Theory and Techniques, Jan. 1984, pp. 71-77, vol. 32, No. 1, IEEE.

Campbell, Charles et al., "A Wideband Power Amplifier MMIC Utilizing GaN on SiC HEMT Technology," IEEE Journal of Solid-State Circuits, Oct. 2009, pp. 2640-2647, vol. 44, No. 10, IEEE.

Duperrier, Cedric et al., "New Design Method of Non-Uniform Distributed Power Amplifiers. Application to a single stage 1 W PHEMT MMIC," 2001 IEEE MTT-S International Microwave Symposium Digest, 2001, pp. 1063-1066, vol. 12, IEEE.

Duperrier, Cedric et al., "New Design Method of Uniform and Non-uniform Distributed Power Amplifiers," IEEE Transactions on Microwave Theory and Techniques, Dec. 2001, pp. 2494-2500, vol. 29, No. 12, IEEE.

Fraysse, J.P. et al., "A 2W high efficiency 2-8GHz cascode HBT MMIC power distributed amplifier," IEEE MTTS Digest, Jun. 2000, pp. 529-532, vol. 1, IEEE.

Gassmann, J. et al., "Wideband, High-Efficiency GaN Power Amplifiers Utilizing a Non-Uniform Distributed Topology," IEEE/MTT-S International Microwave Symposium, Jun. 2007, pp. 615-618, IEEE.

Green, Bruce et al., "Cascode Connected AlGaN/GaN HEMT's on SiC Substrates," IEEE Microwave and Guided Wave Letters, Aug. 2000, pp. 316-318, vol. 10, No. 8, IEEE.

Green, Bruce M. et al., "High-Power Broad-Band AlGaN/GaN HEMT MMICs on SiC Substrates," IEEE Transactions on Microwave Theory and Techniques, Dec. 2001, pp. 2486-2493, vol. 49, No. 12, IEEE.

Martin, A. et al., "Design of GaN-based Balanced Cascode Cells for Wide-band Distributed Power Amplifier," 2007 EuMIC Microwave Integrated Circuit Conference, Oct. 8-10, 2007, pp. 154-157, IEEE.

Meharry, David E. et al., "Multi-Watt Wideband MMICs in GaN and GaAs," IEEE/MTT-S International Microwave Symposium, Jun. 2007, pp. 631-634, IEEE.

Shifrin, M. et al., "A New Power Amplifier Topology With Series Biasing and Power Combining of Transistors," Microwave and Millimeter-Wave Monolithic Circuits Symposium, Jun. 1-3, 1992, pp. 39-41, IEEE.

Van Raay, F. et al., "A Coplanar X-Band AlGaN/GaN Power Amplifier MMIC on s.i. SiC Substrate," IEEE Microwave and Wireless Components Letters, Jul. 2005, pp. 460-462, vol. 15, No. 7, IEEE.

Van Raay, F. et al., "A Microstrip X-Band AlGaN/GaN Power Amplifier MMIC on s.i. SiC Substrate," EGAAS 2005 Gallium Arsenide and Other Semiconductor Application Symposium, Oct. 3-4, 2005, pp. 233-236, IEEE.

Zhao, Lei et al., "A 6 Watt LDMOS Broadband High Efficiency Distributed Power Amplifier Fabricated Using LTCC Technology," 2002 IEEE MTT-S International Microwave Symposium Digest, 2002, pp. 897-900, IEEE.

Nonfinal Office Action mailed Feb. 25, 2011, regarding U.S. Appl. No. 12/651,726.

Nonfinal Office Action mailed Feb. 24, 2011, regarding U.S. Appl. No. 12/651,717.

Notice of Allowance mailed Jun. 24, 2011 regarding U.S. Appl. No. 12/651,726.

Kobayashi, K.W. et al., "Extending the Bandwidth Performance of Heterojunction Bipolar Transistor-based Distributed Amplifiers," IEEE Transactions on Microwave Theory and Techniques, vol. 44, No. 5, May 1996, pp. 739-748.

Robertson, I.D. et al., "Ultrawideband biasing of MMIC distributed amplifiers using improved active load," Electronics Letters, vol. 27, Oct. 10, 1991, pp. 1907-1909.

Notice of Allowance for U.S. Appl. No. 10/304,593 mailed Dec. 8, 2003, 6 pages.

* cited by examiner

CAPACITIVELY-COUPLED DISTRIBUTED AMPLIFIER WITH BASEBAND PERFORMANCE

RELATED APPLICATIONS

This application is a continuation of U.S. patent application Ser. No. 12/651,717, entitled CAPACITIVELY-COUPLED NON-UNIFORMLY DISTRIBUTED AMPLIFIER, filed on Jan. 4, 2010, now U.S. Pat. No. 8,035,449, and is incorporated herein by reference in its entirety. This application is related to U.S. patent application Ser. No. 12/651,726, entitled CAPACITIVELY-COUPLED NON-UNIFORMLY DISTRIBUTED AMPLIFIER, filed on Jan. 4, 2010, now U.S. Pat. No. 8,058,930, and is incorporated herein by reference in its entirety.

The '717 application claims the benefit of provisional patent application Ser. No. 61/142,283, filed Jan. 2, 2009, the disclosure of which is hereby incorporated herein by reference in its entirety.

FIELD OF THE DISCLOSURE

Embodiments of the present disclosure relate to distributed amplifiers, which may be used in radio frequency (RF) communications systems, optical fiber based communications systems, baseband frequency communications systems, or any combination thereof.

BACKGROUND OF THE DISCLOSURE

Several different amplifier applications require an amplifier having a large gain-bandwidth product. For example, RF signals on optical fibers may require large gain-bandwidth product amplifiers that are highly linear. Some broadband fiber and RF communications applications may require large gain-bandwidth product amplifiers to provide high spectral efficiency. Software configurable communications systems may require an amplifier having a large gain-bandwidth product and a very wide operating bandwidth, which may span baseband frequencies to microwave frequencies. Baseband to microwave instrumentation may require an amplifier having a large gain-bandwidth product and a very wide operating bandwidth.

Distributed amplifiers (DAs) typically utilize multiple transconductance elements coupled in series to provide an amplifier having a larger gain-bandwidth product than is possible with an amplifier using a single comparable transconductance element. A DA may have an input line of inductive elements or transmission line segments coupled in series and a parallel output line of inductive elements or transmission line segments coupled in series. The input and the output lines have corresponding taps that are coupled to the multiple transconductance elements, such that an input signal, which is applied to one end of the input line, propagates down the input line. As the input signal propagates down the input line, each successive transconductance element receives and amplifies the input signal to feed a corresponding tap into the output line. Each successive transconductance element adds to the amplified input signal. As such, the amplified input signal propagates down the output line to provide an output signal at the end of the output line. Ideally, the input line and the output line have identical delays, such that the input signal and the amplified input signal stay in phase with one another so that each transconductance element adds to the amplified input signal in phase. However, practical DAs may have phase velocity variations, distortions, or both along the output line that may degrade the linearity of the DA, the efficiency of the DA, or both.

Capacitively-coupled DAs may be used to extend gain-bandwidth products of the DAs. However, capacitive-coupling may limit low frequency operation of the DAs. Thus, there is a need for a capacitively-coupled DA having a large gain-bandwidth product, having a very wide operating bandwidth, and that compensates for phase velocity variations along the output line to maximize linearity and efficiency.

SUMMARY OF THE EMBODIMENTS

The present disclosure relates to a capacitively-coupled distributed amplifier (DA) having an input line and an output line that are coupled to one another through a broadband interface network and DA segments. The input line receives an input signal and the output line provides an output signal based on amplifying the input signal. The broadband interface network includes a group of capacitive elements coupled between the input line and the DA segments to extend a gain-bandwidth product of the DA. The broadband interface network further includes a resistor divider network coupled between the input line and the DA segments to extend a lower end of an operating bandwidth of the DA. As such, the operating bandwidth of the DA may extend from baseband frequencies to microwave frequencies.

In one embodiment of the capacitively-coupled DA, the output line is non-uniformly distributed to provide a capacitively-coupled non-uniformly distributed amplifier (NDA). As such, if the output line includes inductive elements, an inductance of each inductive element decreases moving from an input end of the output line to an output end of the output line to compensate for decreasing impedance along the output line. If the output line includes transmission line segments, an impedance of each transmission line segment decreases moving from the input end of the output line to the output end of the output line to compensate for decreasing impedance along the output line.

The capacitively-coupled NDA may have phase velocity variations along the output line. In one embodiment of the capacitively-coupled NDA, to compensate for the phase velocity variations, a capacitance of each capacitive element that is coupled to the input line decreases moving from an input end of the input line to an output end of the input line. However, the decreasing capacitances may cause uneven capacitive coupling to the DA segments. Such uneven capacitive coupling may cause uneven voltage division of input signals from the input line to the DA segments. As such, the DA segments may include tapered gate periphery transconductance devices to correct for the uneven voltage division.

Tapered gate periphery transconductance devices may also be used to broaden an output power bandwidth of the capacitively-coupled NDA by increasing an output impedance presented from each DA segment to the output line moving from the input end of the output line to the output end of the output line. In one embodiment of the capacitively-coupled NDA, each DA segment includes a single tapered gate periphery transconductance device, which may be used to correct for the uneven voltage division, broaden the output power bandwidth of the capacitively-coupled NDA, or both. In an alternate embodiment of the capacitively-coupled NDA, the DA segments are cascode DA segments including input transconductance devices and output transconductance devices. Each DA segment may include an input transconductance device coupled to an output transconductance device in a cascode configuration. The input transconductance device is coupled to the input line through the broadband interface network and the output transconductance device is coupled to the output line.

By using cascode DA segments, four degrees of freedom may be available to optimize the capacitively-coupled NDA. The first degree of freedom may be provided by decreasing capacitances of the capacitive elements moving from the input end of the input line to the output end of the input line to compensate for the phase velocity variations. The second degree of freedom may be provided by using tapered gate periphery input transconductance devices to compensate for uneven voltage division caused by the decreasing capacitances of the capacitive elements. The third degree of freedom may be provided by adjusting a voltage division ratio of the resistor divider network to compensate for the uneven voltage division caused by the decreasing capacitances of the capacitive elements. The fourth degree of freedom may be provided by using tapered gate periphery output transconductance devices to increase the output impedance presented from each DA segment to the output line moving from the input end of the output line to the output end of the output line to broaden the output power bandwidth of the capacitively-coupled NDA.

In one embodiment of the capacitively-coupled DA, a drain termination load network may be coupled to the input end of the output line to provide at least a partial impedance match to the output line. A gate termination load network may be coupled to the output end of the input line to provide at least a partial impedance match to the input line.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION OF THE PREFERRED EMBODIMENTS

Figure 1:
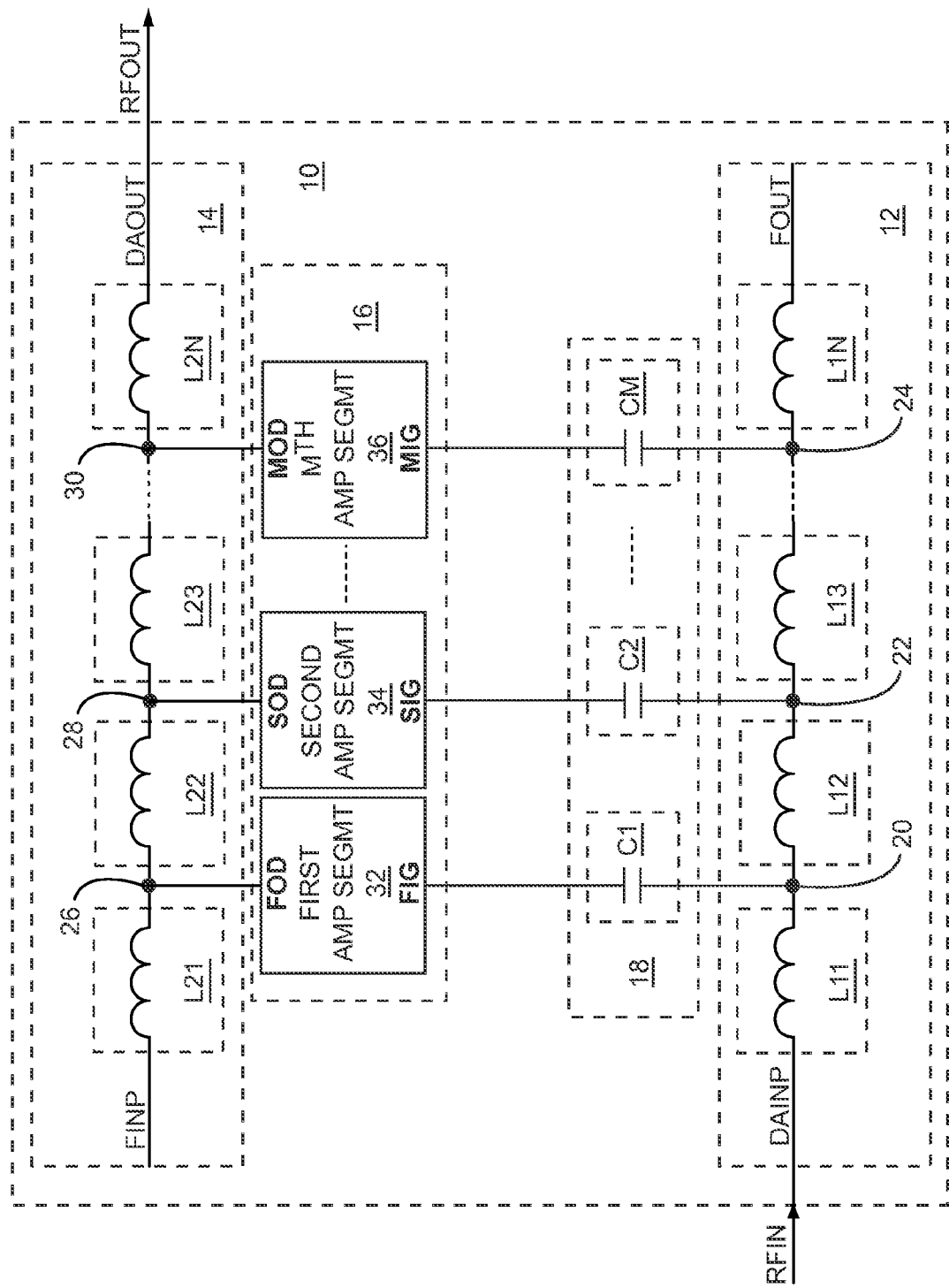
FIG. 1 shows a distributed amplifier (DA) according to one embodiment of the DA.

The embodiments set forth below represent the necessary information to enable those skilled in the art to practice the disclosure and illustrate the best mode of practicing the disclosure. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

The present disclosure relates to a capacitively-coupled distributed amplifier (DA) having an input line and an output line that are coupled to one another through a broadband interface network and DA segments. The input line receives an input signal and the output line provides an output signal based on amplifying the input signal. The broadband interface network includes a group of capacitive elements coupled between the input line and the DA segments to extend a gain-bandwidth product of the DA.

In one embodiment of the capacitively-coupled DA, the broadband interface network further includes a resistor divider network coupled between the input line and the DA segments to extend a lower end of an operating bandwidth of the DA. As such, the operating bandwidth of the DA may extend from baseband frequencies to microwave frequencies.

In one embodiment of the capacitively-coupled DA, the output line is non-uniformly distributed to provide a capacitively-coupled non-uniformly distributed amplifier (NDA). As such, if the output line includes inductive elements, an inductance of each inductive element decreases moving from an input end of the output line to an output end of the output line to compensate for decreasing impedance along the output line. If the output line includes transmission line segments, an impedance of each transmission line segment decreases moving from the input end of the output line to the output end of the output line to compensate for decreasing impedance along the output line.

The capacitively-coupled NDA may have phase velocity variations along the output line. In one embodiment of the capacitively-coupled NDA, to compensate for the phase velocity variations, a capacitance of each capacitive element that is coupled to the input line decreases moving from an input end of the input line to an output end of the input line. However, the decreasing capacitances may cause uneven capacitive coupling to the DA segments. Such uneven capacitive coupling may cause uneven voltage division of input signals from the input line to the DA segments. As such, the DA segments may include tapered gate periphery transconductance devices to correct for the uneven voltage division.

Tapered gate periphery transconductance devices may also be used to broaden an output power bandwidth of the capacitively-coupled NDA by increasing an output impedance presented from each DA segment to the output line moving from the input end of the output line to the output end of the output line. In one embodiment of the capacitively-coupled NDA, each DA segment includes a single tapered gate periphery transconductance device, which may be used to correct for the uneven voltage division, broaden the output power bandwidth of the capacitively-coupled NDA, or both. In an alternate embodiment of the capacitively-coupled NDA, the DA segments are cascode DA segments including input transconductance devices and output transconductance devices. Each DA segment may include an input transconductance device coupled to an output transconductance device in a cascode configuration. The input transconductance device is coupled to the input line through the broadband interface network and the output transconductance device is coupled to the output line.

By using cascode DA segments, four degrees of freedom may be available to optimize the capacitively-coupled NDA. The first degree of freedom may be provided by decreasing capacitances of the capacitive elements moving from the input end of the input line to the output end of the input line to compensate for the phase velocity variations. The second degree of freedom may be provided by using tapered gate periphery input transconductance devices to compensate for uneven voltage division caused by the decreasing capacitances of the capacitive elements. The third degree of freedom may be provided by adjusting a voltage division ratio of the resistor divider network to compensate for the uneven voltage division caused by the decreasing capacitances of the capacitive elements. The fourth degree of freedom may be provided by using tapered gate periphery output transconductance devices to increase the output impedance presented from each DA segment to the output line moving from the input end of the output line to the output end of the output line to broaden the output power bandwidth of the capacitively-coupled NDA.

In one embodiment of the capacitively-coupled DA, a drain termination load network may be coupled to the input end of the output line to provide at least a partial impedance match to the output line. A gate termination load network may be coupled to the output end of the input line to provide at least a partial impedance match to the input line.

FIG. 1 shows a DA 10 according to one embodiment of the DA 10. The DA 10 illustrated in FIG. 1 is a capacitively-coupled DA. The DA 10 includes an input line having a first group 12 of inductive elements, an output line having a second group 14 of inductive elements, DA segments 16, and an input network 18. The first group 12 of inductive elements includes a first group first inductive element L11, a first group second inductive element L12, a first group third inductive element L13, and up to and including a first group $N^{TH}$ inductive element L1N coupled between a DA input DAINP and a first output FOUT. The DA input DAINP is the input end of the input line and the first output FOUT is the output end of the input line. The second group 14 of inductive elements includes a second group first inductive element L21, a second group second inductive element L22, a second group third inductive element L23, and up to and including a second group $N^{TH}$ inductive element L2N coupled between a first input FINP and a DA output DAOUT. The first input FINP is the input end of the output line and the DA output DAOUT is the output end of the output line. As such, the first group first inductive element L11 is coupled to the DA input DAINP, the first group $N^{TH}$ inductive element L1N is coupled to the first output FOUT, the second group first inductive element L21 is coupled to the first input FINP, and the second group $N^{TH}$ inductive element L2N is coupled to the DA output DAOUT.

A first group first connection node 20 is coupled to the first group first inductive element L11 and to the first group second inductive element L12. A first group second connection node 22 is coupled to the first group second inductive element L12 and to the first group third inductive element L13. A first group $M^{TH}$ connection node 24 is coupled to a first group $M^{TH}$ inductive element (not shown) and to the first group $N^{TH}$ inductive element L1N. A second group first connection node 26 is coupled to the second group first inductive element L21 and to the second group second inductive element L22. A second group second connection node 28 is coupled to the second group second inductive element L22 and to the second group third inductive element L23. A second group $M^{TH}$ connection node 30 is coupled to a second group $M^{TH}$ inductive element (not shown) and to the second group $N^{TH}$ inductive element L2N. As such, N is equal to M plus one. In an exemplary embodiment of the DA 10, M is equal to three and N is equal to four.

The DA segments 16 include a first amplifier segment 32 having a first input gate FIG and a first output drain FOD, a second amplifier segment 34 having a second input gate SIG and a second output drain SOD, and up to and including an $M^{TH}$ amplifier segment 36 having an $M^{TH}$ input gate MIG and an $M^{TH}$ output drain MOD. The first output drain FOD is coupled to the second group first connection node 26, the second output drain SOD is coupled to the second group second connection node 28, and the $M^{TH}$ output drain MOD is coupled to the second group $M^{TH}$ connection node 30.

The input network 18 includes a group of capacitive elements having a first capacitive element C1 coupled between the first group first connection node 20 and the first input gate FIG, a second capacitive element C2 coupled between the first group second connection node 22 and the second input gate SIG, and up to and including an $M^{TH}$ capacitive element CM coupled between the first group $M^{TH}$ connection node 24 and the $M^{TH}$ input gate MIG. The group of capacitive elements may extend a gain-bandwidth product of the DA 10. An RF input signal RFIN feeds the DA input DAINP and the DA output DAOUT provides an RF output signal RFOUT based on amplifying the RF input signal RFIN.

Operation of the DA 10 is described below. The RF input signal RFIN feeds the first group 12 of inductive elements through the DA input DAINP and propagates down the first group 12 of inductive elements through the first group first inductive element L11, through the first group second inductive element L12, through the first group third inductive element L13, and through the first group $N^{TH}$ inductive element L1N. After propagating through the first group first inductive element L11, a portion of the RF input signal RFIN is capacitively-coupled to the first input gate FIG through the first capacitive element C1. Then, after propagating through the first group second inductive element L12, a portion of the RF input signal RFIN is capacitively-coupled to the second input gate SIG through the second capacitive element C2. Next, after propagating through the first group third inductive element L13 and up to and including the first group $M^{TH}$ inductive element (not shown), a portion of the RF input signal RFIN is capacitively-coupled to the $M^{TH}$ input gate MIG through the $M^{TH}$ capacitive element CM. The first, the second, and up to and including the $M^{TH}$ amplifier segments 32,

34, 36 amplify their respective portions of the RF input signal RFIN to provide corresponding amplified portions of the RF input signal RFIN from the first, the second, and up to and including the $M^{TH}$ output drains FOD, SOD, MOD to feed the second group first connection node 26, the second group second connection node 28, and up to and including the second group $M^{TH}$ connection node 30, respectively.

The amplified portions of the RF input signal RFIN propagate down the second group 14 of inductive elements through the second group first inductive element L21, through the second group second inductive element L22, through the second group third inductive element L23, through the second group $N^{TH}$ inductive element L2N, and through the DA output DAOUT to provide the RF output signal RFOUT. Specifically, the amplified portion of the RF input signal RFIN fed to the second group first connection node 26 feeds the second group second inductive element L22. After propagating through the second group second inductive element L22, the propagating amplified portion of the RF input signal RFIN is added to the amplified portion of the RF input signal RFIN from the second output drain SOD. After propagating through the second group third inductive element L23 and up to and including the second group $M^{TH}$ inductive element (not shown), the propagating amplified portion of the RF input signal RFIN is added to the amplified portion of the RF input signal RFIN from the $M^{TH}$ output drain MOD.

Ideally, the first group 12 of inductive elements and the second group 14 of inductive elements have identical delays, such that the portions of the RF input signal RFIN and the amplified portions of the RF input signal RFIN add together in phase. However, the DA 10 may have phase velocity variations, distortions, or both along the second group 14 of inductive elements that may degrade linearity of the DA 10, the efficiency of the DA 10, or both.

In one embodiment of the DA 10, the second group 14 of inductive elements is non-uniformly distributed, such that the DA 10 is a capacitively-coupled NDA. An inductance of each of the second group 14 of inductive elements may decrease moving from the first input FINP to the DA output DAOUT to compensate for decreasing impedance along the second group 14 of inductive elements. Since the amplified portions of the RF input signal RFIN propagate down the second group 14 of inductive elements, an impedance match between each of the second group 14 of inductive elements and the combination of upstream elements feeding the respective inductive elements may provide desired behavior of the DA 10. Specifically, an inductance of the second group second inductive element L22 may be matched to the parallel combination of the impedance presented by the first output drain FOD and the series combination of the second group first inductive element L21 and circuitry feeding the second group first inductive element L21. As such, the inductance of the second group second inductive element L22 is less than the inductance of the second group first inductive element L21. Similarly, an inductance of the second group third inductive element L23 may be matched to the parallel combination of the impedance presented by the second output drain SOD and the series combination of the second group second inductive element L22 and circuitry feeding the second group second inductive element L22. As such, the inductance of the second group third inductive element L23 is less than the inductance of the second group second inductive element L22. This decreasing inductance characteristic is repeated down the second group 14 of inductive elements toward the DA output DAOUT.

In one embodiment of the DA 10, the DA 10 is a distributed power amplifier (DPA). In one embodiment of the DA segments 16, the DA segments 16 include Gallium Nitride.

Figure 2:
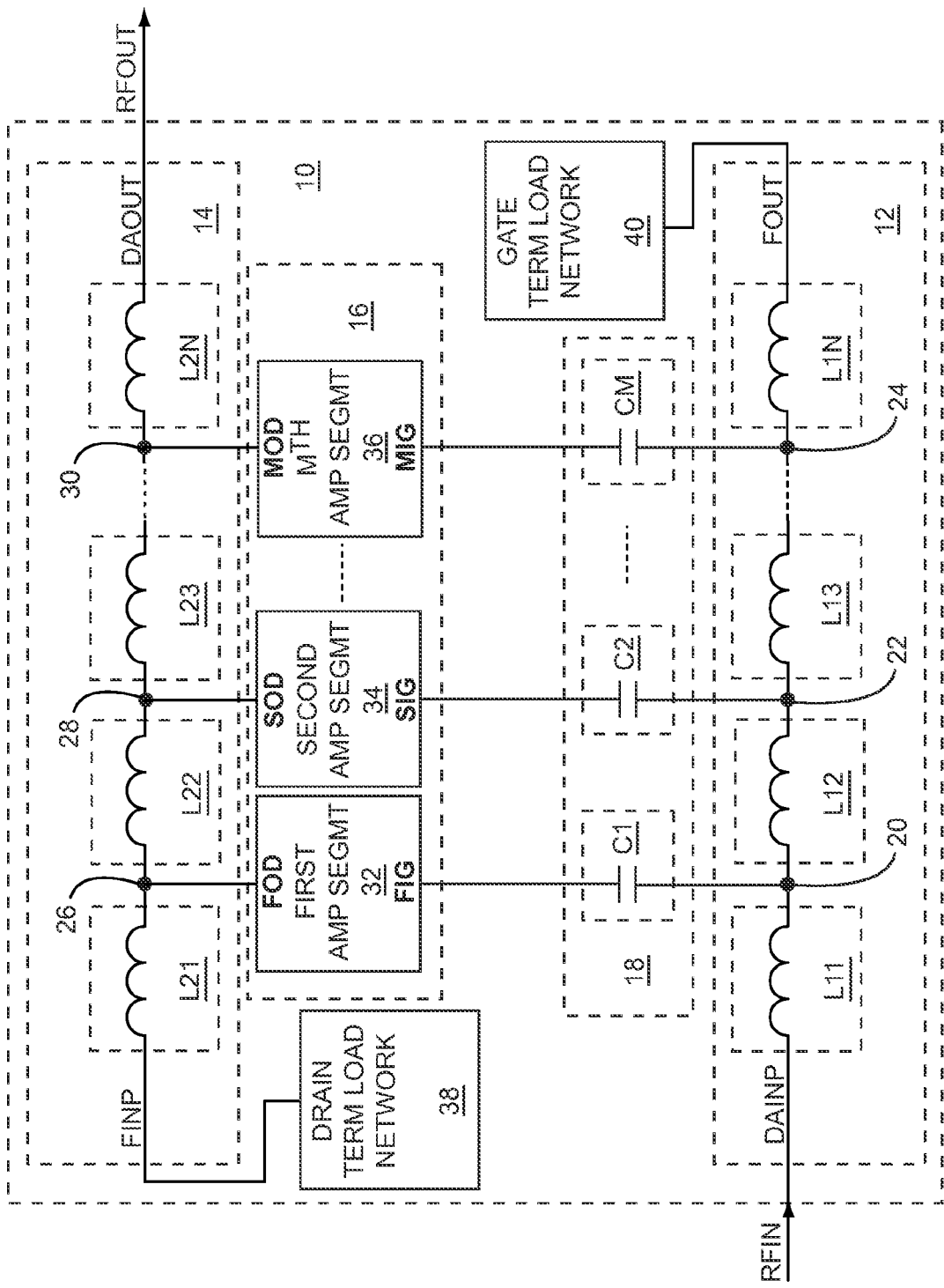
FIG. 2 shows the DA according to an alternate embodiment of the DA.

FIG. 2 shows the DA 10 according to an alternate embodiment of the DA 10. The DA 10 illustrated in FIG. 2 is similar to the DA 10 illustrated in FIG. 1 except the DA 10 illustrated in FIG. 2 includes a drain termination load network 38 coupled to the first input FINP and a gate termination load network 40 coupled to the first output FOUT. The drain termination load network 38 may provide at least a partial impedance match to the second group 14 of inductive elements, particularly at low frequencies to preserve a low frequency impedance match and help provide an appropriate power response from the DA 10, thereby helping extend the lower end of the operating bandwidth of the DA 10. The second group first inductive element L21 may at least partially isolate the drain termination load network 38 from the second group 14 of inductive elements at higher frequencies to preserve efficiency of the DA 10. Similarly, the gate termination load network 40 may provide at least a partial impedance match to the first group 12 of inductive elements, particularly at low frequencies. The first group $N^{TH}$ inductive element L1N may at least partially isolate the gate termination load network 40 from the first group 12 of inductive elements at higher frequencies.

Figure 3:
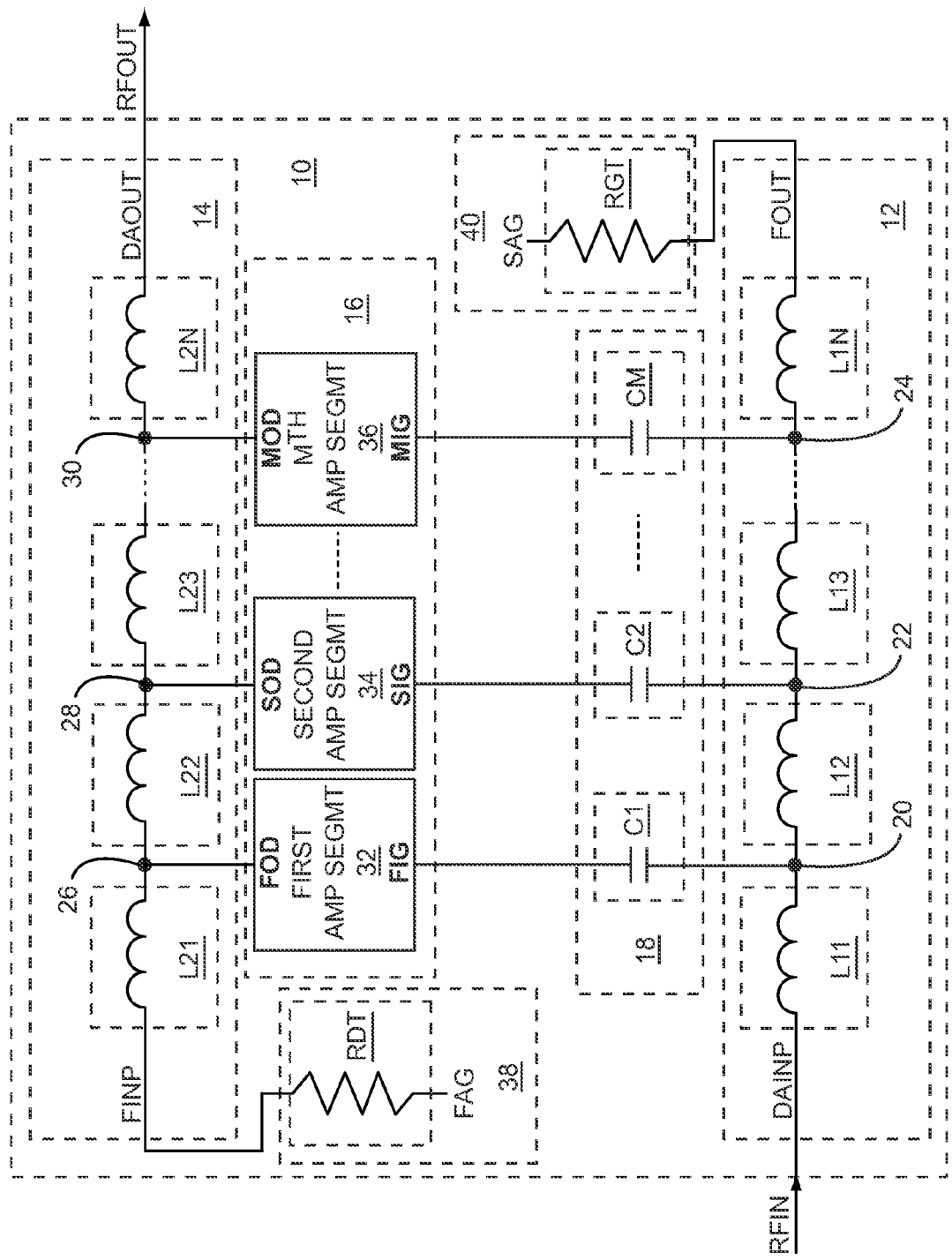
FIG. 3 shows details of a drain termination load network and a gate termination load network illustrated in FIG. 2 according to one embodiment of the drain and the gate termination load networks.

FIG. 3 shows details of the drain termination load network 38 and the gate termination load network 40 illustrated in FIG. 2 according to one embodiment of the drain and the gate termination load networks 38, 40. The drain termination load network 38 includes a drain termination resistive element RDT coupled between the first input FINP and a first AC ground FAG. The gate termination load network 40 includes a gate termination resistive element RGT coupled between the first output FOUT and a second AC ground SAG.

In one embodiment of the DA 10, a load (not shown) having a load resistance is coupled to the DA output DAOUT. In a first exemplary embodiment of the DA 10, a resistance of the drain termination resistive element RDT is greater than about one-half of the load resistance and the resistance of the drain termination resistive element RDT is less than about three times the load resistance. In a second exemplary embodiment of the DA 10, the resistance of the drain termination resistive element RDT is equal to about one-half of the load resistance.

Figure 4:
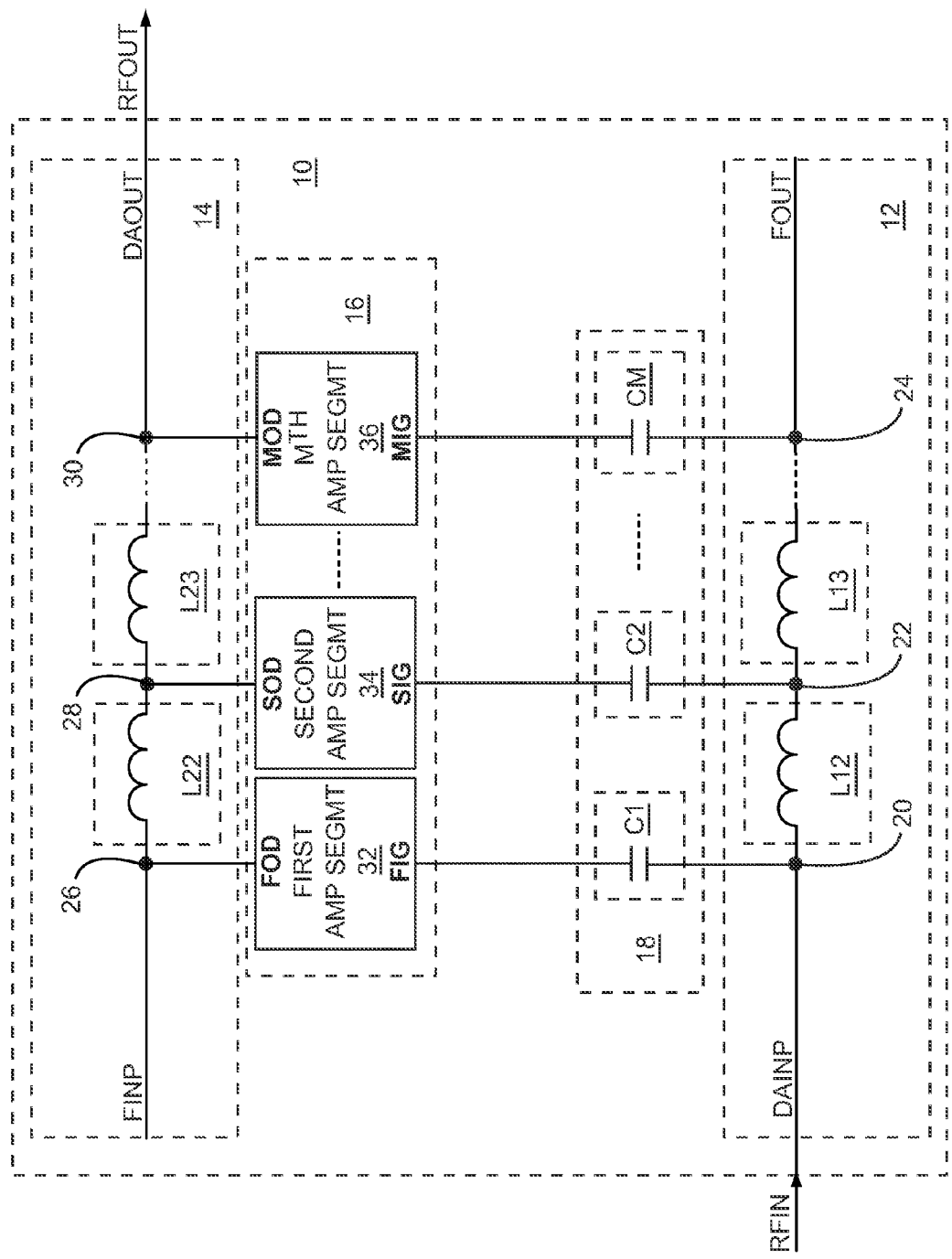
FIG. 4 shows details of a first group of inductive elements and a second group of inductive elements illustrated in FIG. 1 according to an alternate embodiment of the first group of inductive elements and the second group of inductive elements.

FIG. 4 shows details of the first group 12 of inductive elements and the second group 14 of inductive elements illustrated in FIG. 1 according to an alternate embodiment of the first group 12 of inductive elements and the second group 14 of inductive elements. The first group 12 of inductive elements and the second group 14 of inductive elements illustrated in FIG. 4 are similar to the first group 12 of inductive elements and the second group 14 of inductive elements illustrated in FIG. 1 except in the first group 12 of inductive elements and the second group 14 of inductive elements illustrated in FIG. 4, the first group first inductive element L11, the first group $N^{TH}$ inductive element L1N, the second group first inductive element L21, and the second group $N^{TH}$ inductive element L2N are omitted.

As such, the DA input DAINP is coupled to the first group first connection node 20 instead of being coupled to the first group first inductive element L11. The first output FOUT is coupled to the first group $M^{TH}$ connection node 24 instead of being coupled to the first group $N^{TH}$ inductive element L1N. The first input FINP is coupled to the second group first connection node 26 instead of being coupled to the second group first inductive element L21. The DA output DAOUT is coupled to the second group $M^{TH}$ connection node 30 instead of being coupled to the second group $N^{TH}$ inductive element L2N. In additional embodiments of the first group 12 of inductive elements, the first group first inductive element L11 or the first group $N^{TH}$ inductive element L1N may not be omitted from the first group 12 of inductive elements. Further, in additional embodiments of the second group 14 of inductive elements, the second group first inductive element L21 or the second group $N^{TH}$ inductive element L2N may not be omitted from the second group 14 of inductive elements.

Figure 5:
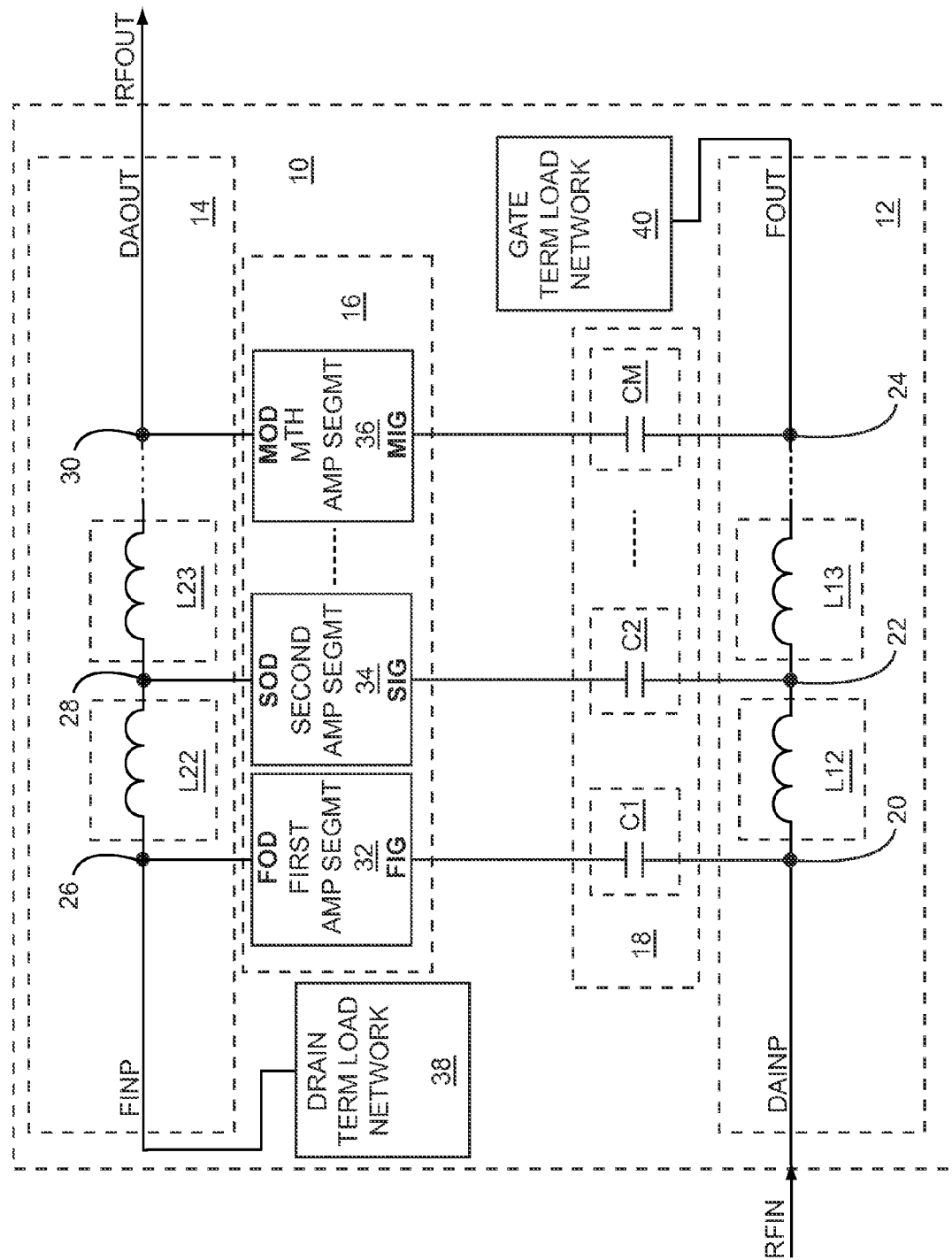
FIG. 5 shows details of the first group of inductive elements and the second group of inductive elements illustrated in FIG. 2 according to the alternate embodiment of the first group of inductive elements and the second group of inductive elements.

FIG. 5 shows details of the first group 12 of inductive elements and the second group 14 of inductive elements illustrated in FIG. 2 according to the alternate embodiment of the first group 12 of inductive elements and the second group 14 of inductive elements. The first group 12 of inductive elements and the second group 14 of inductive elements illustrated in FIG. 5 are similar to the first group 12 of inductive elements and the second group 14 of inductive elements illustrated in FIG. 2 except in the first group 12 of inductive elements and the second group 14 of inductive elements illustrated in FIG. 5, the first group first inductive element L11, the first group $N^{TH}$ inductive element L1N, the second group first inductive element L21, and the second group $N^{TH}$ inductive element L2N are omitted.

As such, the DA input DAINP is coupled to the first group first connection node 20 instead of being coupled to the first group first inductive element L11. The first output FOUT is coupled to the first group $M^{TH}$ connection node 24 instead of being coupled to the first group $N^{TH}$ inductive element L1N. The first input FINP is coupled to the second group first connection node 26 instead of being coupled to the second group first inductive element L21. The DA output DAOUT is coupled to the second group $M^{TH}$ connection node 30 instead of being coupled to the second group $N^{TH}$ inductive element L2N. In additional embodiments of the first group 12 of inductive elements, the first group first inductive element L11 or the first group $N^{TH}$ inductive element L1N may not be omitted from the first group 12 of inductive elements. Further, in additional embodiments of the second group 14 of inductive elements, the second group first inductive element L21 or the second group $N^{TH}$ inductive element L2N may not be omitted from the second group 14 of inductive elements.

Figure 6:
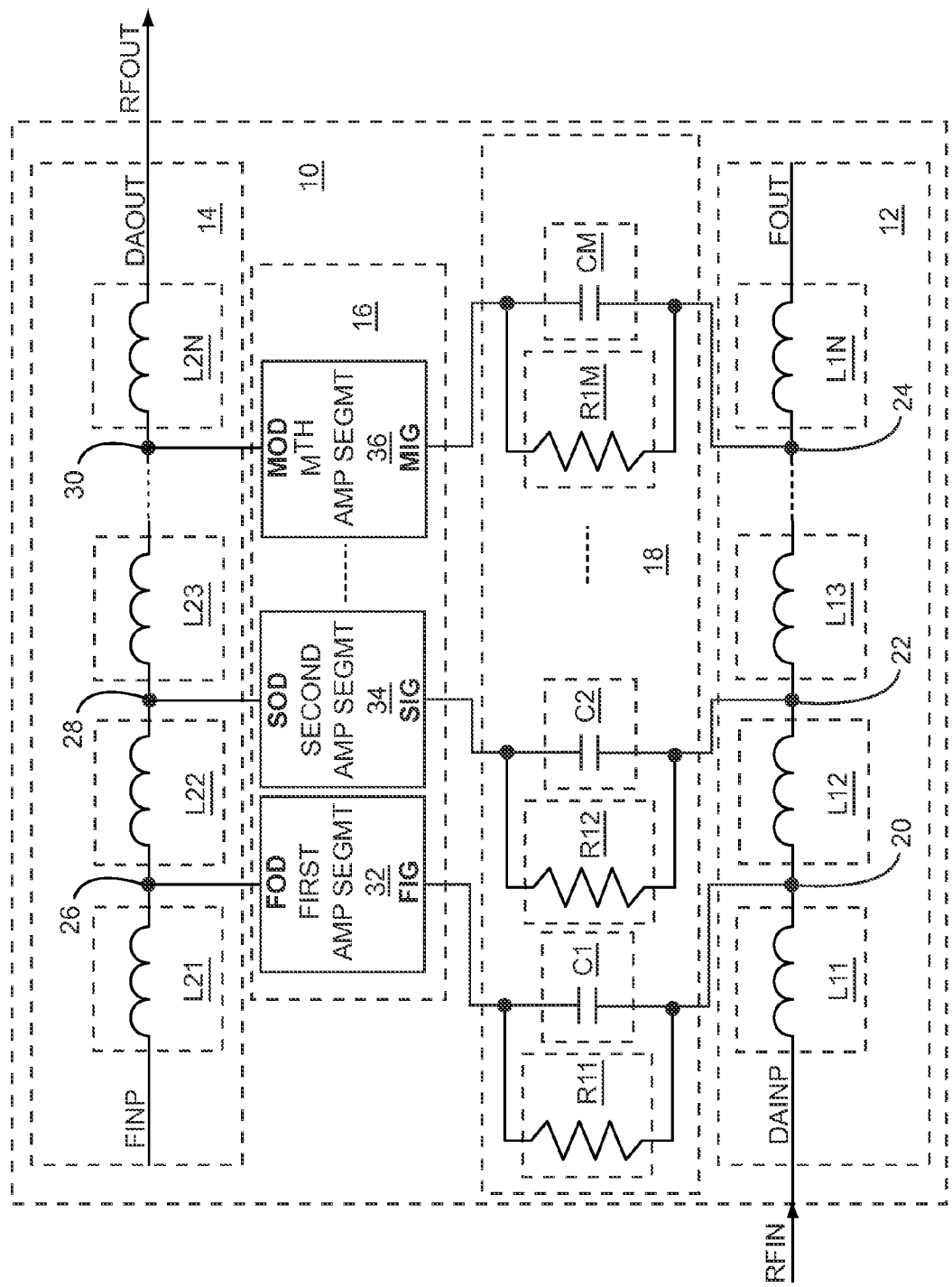
FIG. 6 shows details of an input network illustrated in FIG. 1 according to an alternate embodiment of the input network.

FIG. 6 shows details of the input network 18 illustrated in FIG. 1 according to an alternate embodiment of the input network 18. The input network 18 illustrated in FIG. 6 is similar to the input network 18 illustrated in FIG. 1 except the input network 18 illustrated in FIG. 6 further includes a first group of resistive elements having a first group first resistive element R11 coupled in parallel with the first capacitive element C1, a first group second resistive element R12 coupled in parallel with the second capacitive element C2, and up to and including a first group $M^{TH}$ resistive element R1M coupled in parallel with the $M^{TH}$ capacitive element CM.

Figure 7:
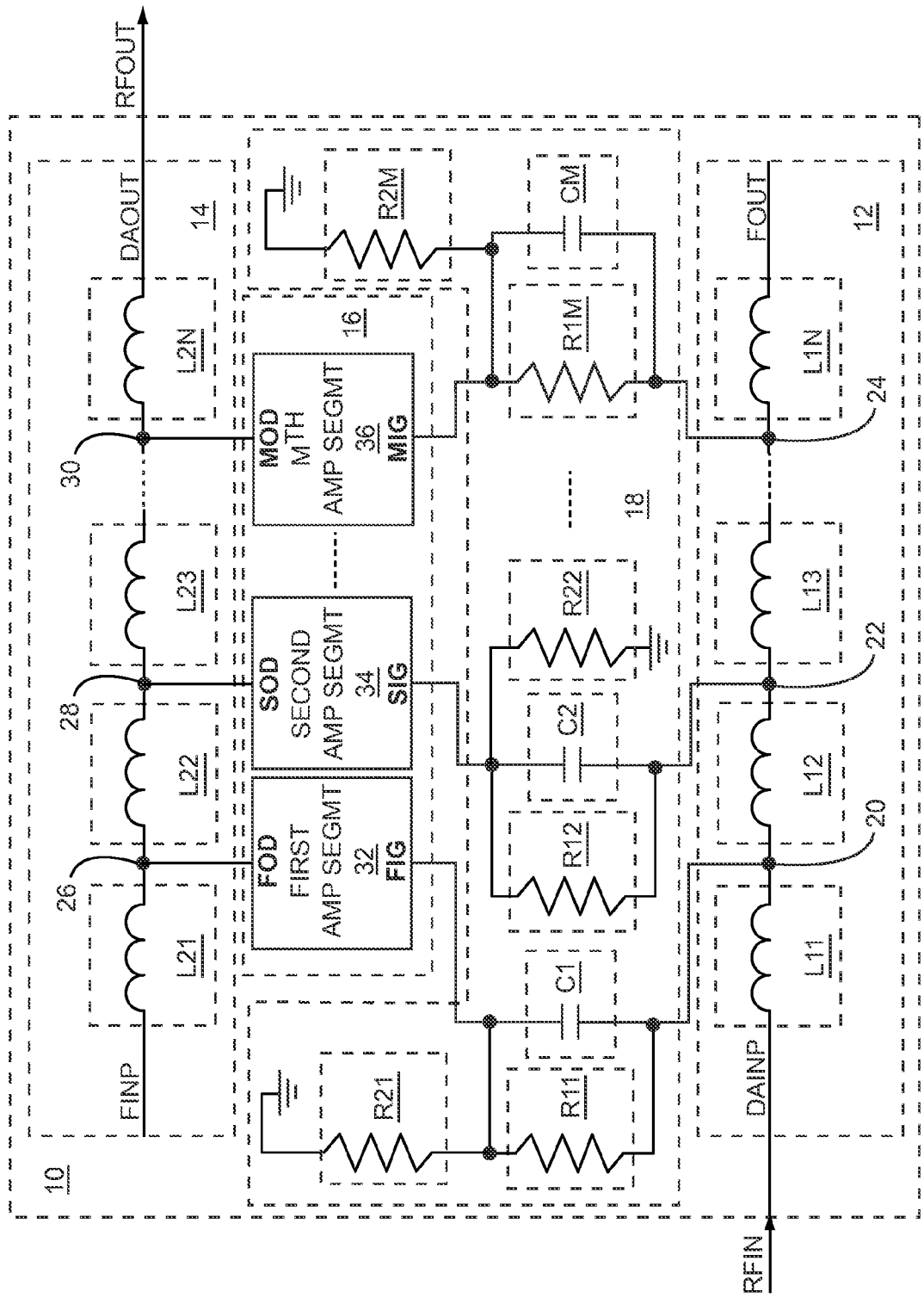
FIG. 7 shows details of the input network illustrated in FIG. 1 according to an additional embodiment of the input network.

FIG. 7 shows details of the input network 18 illustrated in FIG. 1 according to an additional embodiment of the input network 18. The input network 18 illustrated in FIG. 7 is similar to the input network 18 illustrated in FIG. 6 except the input network 18 illustrated in FIG. 7 further includes a second group of resistive elements having a second group first resistive element R21 coupled between the first input gate FIG and ground, a second group second resistive element R22 coupled between the second input gate SIG and ground, and up to and including a second group $M^{TH}$ resistive element R2M coupled between the $M^{TH}$ input gate MIG and ground. The first and the second groups of resistive elements form a resistive divider network, which may provide a low frequency voltage division network. The group of capacitive elements and input capacitances to the DA segments 16 may form a capacitive divider network, which may provide a high frequency voltage division network.

Specifically, a first resistive division ratio (FRDR) may be equal to a resistance of the second group first resistive element R21 divided by a sum of the resistance of the second group first resistive element R21 and a resistance of the first group first resistive element R11 as shown in EQ. 1 below.

$$FRDR = \left[\frac{R21}{(R11 + R21)}\right]. \qquad \text{EQ. 1}$$

A voltage at the first input gate FIG provided by the first group first resistive element R11 and the second group first resistive element R21 may be obtained by multiplying the FRDR times a voltage at the first group first connection node 20.

A first capacitive division ratio (FCDR) may be equal to a capacitance of the first capacitive element C1 divided by a sum of the capacitance of the first capacitive element C1 and a first gate-to-source capacitance $C_{GS1}$ between the first input gate FIG and ground as shown in EQ. 2 below.

$$FCDR = \left[\frac{C1}{(C1 + C_{GS1})}\right]. \qquad \text{EQ. 2}$$

A voltage at the first input gate FIG provided by the first capacitive element C1 and the first gate-to-source capacitance $C_{GS1}$ may be obtained by multiplying the FCDR times a voltage at the first group first connection node 20. By making the FCDR about equal to the FRDR, the input network 18 may provide coupling from the first group first connection node 20 to the first input gate FIG covering a very wide bandwidth.

Similarly, the first group second resistive element R12 and the second group second resistive element R22 may have a second resistive division ratio (SRDR), and the second capacitive element C2 and a second gate-to-source capacitance $C_{GS2}$ between the second input gate SIG and ground may have a second capacitive division ratio (SCDR) as shown in EQ. 3 and EQ. 4 below.

$$SRDR = \left[\frac{R22}{(R12 + R22)}\right]. \qquad \text{EQ. 3}$$

$$SCDR = \left[\frac{C2}{(C2 + C_{GS2})}\right]. \qquad \text{EQ. 4}$$

By making the SCDR about equal to the SRDR, the input network 18 may provide coupling from the first group second connection node 22 to the second input gate SIG covering a very wide bandwidth.

The first group first resistive element R11, the second group first resistive element R21, the first capacitive element C1, and the first gate-to-source capacitance $C_{GS1}$ may form a first network segment. Similarly, the second group first resistive element R21, the second group second resistive element R22, the second capacitive element C2, and the second gate-to-source capacitance $C_{GS2}$ may form a second network segment.

In general, an $i^{TH}$ group first resistive element Ri1, an $i^{TH}$ group second resistive element Ri2, an $i^{TH}$ capacitive element Ci, and an $i^{TH}$ gate-to-source capacitance $C_{GSi}$ may form an $i^{TH}$ network segment. A first ratio (FR) may be equal to a capacitance of the $i^{TH}$ capacitive element Ci divided by a sum of the capacitance of the $i^{TH}$ capacitive element Ci and the $i^{TH}$ gate-to-source capacitance $C_{GSi}$ as shown in EQ. 5 below.

$$FR = \left[\frac{Ci}{(Ci + G_{GSi})}\right].$$ EQ. 5

A second ratio (SR) may be equal to a resistance of the $i^{TH}$ group second resistive element Ri2 divided by a sum of the resistance of the $i^{TH}$ group second resistive element Ri2 and a resistance of the $i^{TH}$ group first resistive element Ri1 as shown in EQ. 6 below.

$$SR = \left[\frac{R2i}{(R1i + R2i)}\right].$$ EQ. 6

By making the FR about equal to the SR as shown in EQ. 7 below, the $i^{TH}$ network segment may cover a very wide bandwidth and the input network 18 may be a broadband interface network. An operating bandwidth of the DA 10 may extend from below 10 megahertz to above 20 gigahertz.

$$\left[\frac{Ci}{(Ci + C_{GSi})}\right] = \left[\frac{R2i}{(R1i + R2i)}\right].$$ EQ. 7

On the other hand, a finite lower cut-off frequency $f_{CL}$ of the capacitive-coupled portion of the input network 18 as illustrated in FIG. 1 may be defined by EQ. 8 and EQ. 9 as shown below.

$$f_{CL} = \left[\frac{1}{(\pi\sqrt{CL})}\right],$$ EQ. 8

$$C = \left[\frac{(Ci \cdot C_{GSi})}{(Ci + C_{GSi})}\right],$$ EQ. 9 where L is equal to an inductance of each of the first group 12 of inductive elements. Without the first and the second groups of resistive elements (FIG. 7), the lower cut-off frequency $f_{CL}$ would not extend performance down to baseband.

Figure 8:
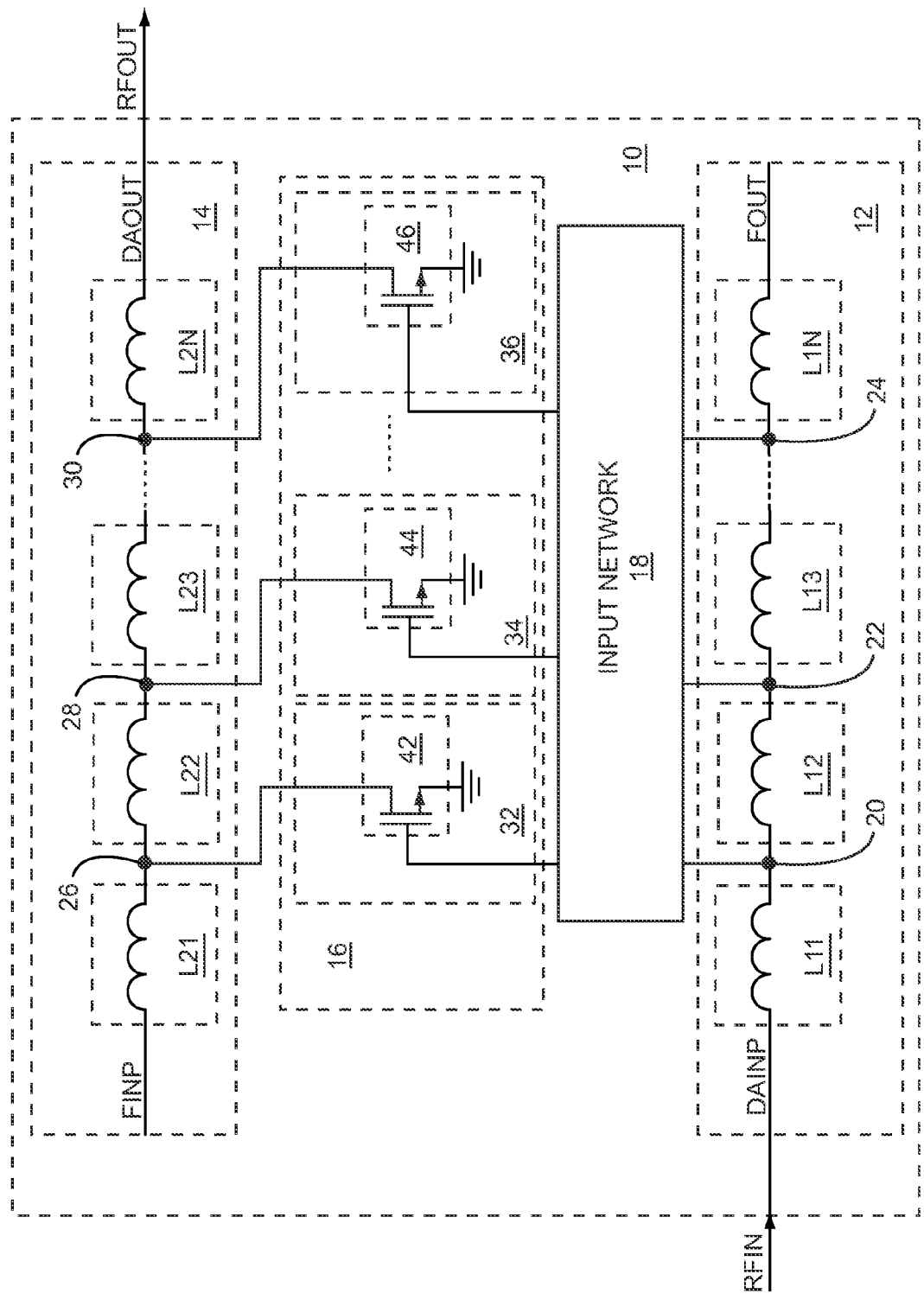
FIG. 8 shows details of first, second, and $M^{TH}$ amplifier segments illustrated in FIG. 7 according to one embodiment of the first, the second, and the $M^{TH}$ amplifier segments.

FIG. 8 shows details of the first, the second, and the $M^{TH}$ amplifier segments 32, 34, 36 illustrated in FIG. 7 according to one embodiment of the first, the second, and the $M^{TH}$ amplifier segments 32, 34, 36. The first, the second, and the $M^{TH}$ amplifier segments 32, 34, 36 illustrated in FIG. 8 are single-transistor element amplifier segments. The first amplifier segment 32 includes a first common source transistor element 42 having the first input gate FIG, the first output drain FOD, and a first input source, which is coupled to ground. The second amplifier segment 34 includes a second common source transistor element 44 having the second input gate SIG, the second output drain SOD, and a second input source, which is coupled to ground. The $M^{TH}$ amplifier segment 36 includes an $M^{TH}$ common source transistor element 46 having the $M^{TH}$ input gate MIG, the $M^{TH}$ output drain MOD, and an $M^{TH}$ input source, which is coupled to ground.

The first common source transistor element 42 has the first gate-to-source capacitance $C_{GS1}$ between the first input gate FIG and the first input source. The second common source transistor element 44 has the second gate-to-source capacitance $C_{GS2}$ between the second input gate SIG and the second input source. The $M^{TH}$ common source transistor element 46 has an $M^{TH}$ gate-to-source capacitance $C_{GSM}$ between the $M^{TH}$ input gate MIG and the $M^{TH}$ input source.

As previously mentioned, in one embodiment of the DA 10, the second group 14 of inductive elements is non-uniformly distributed, such that the DA 10 is a capacitively-coupled NDA. An inductance of each of the second group 14 of inductive elements may decrease moving from the first input FINP to the DA output DAOUT to compensate for decreasing impedance along the second group 14 of inductive elements. As such, the capacitively-coupled NDA may have phase velocity variations along the second group 14 of inductive elements. To compensate for the phase velocity variations, a capacitance of each of the group of capacitive elements (FIG. 7) may decrease moving from the DA input DAINP to the first output FOUT to compensate for varying phase velocity along the second group 14 of inductive elements. Specifically, a capacitance of the second capacitive element C2 may be less than a capacitance of the first capacitive element C1. Each successive capacitive element may have a capacitance that is less than its predecessor down to the $M^{TH}$ capacitive element CM, which has a capacitance that is less than any preceding capacitances. However, the decreasing capacitances may cause uneven capacitive coupling to the DA segments 16. Uneven capacitive coupling may cause uneven division of input signals from the first group 12 of inductive elements to the DA segments 16.

In one embodiment of the DA segments 16, the common source transistor elements 42, 44, 46 are tapered gate periphery common source transistor elements, such that a gate periphery of each of the common source transistor elements 42, 44, 46 decreases moving from the DA input DAINP to the first output FOUT. The gate peripheries may be decreased by decreasing gate widths, decreasing gate lengths, or both.

The decreasing gate peripheries may decrease gate-to-source capacitances and may increase output impedances of the tapered gate periphery common source transistor elements 42, 44, 46. As such, the gate-to-source capacitance of each of the tapered gate periphery common source transistor elements 42, 44, 46 decreases moving from the DA input DAINP to the first output FOUT. Specifically, the second gate-to-source capacitance $C_{GS2}$ may be less than the first gate-to-source capacitance $C_{GS1}$. Each successive gate-to-source capacitance may be less than its predecessor down to the $M^{TH}$ gate-to-source capacitance $C_{GSM}$, which is less than any preceding capacitances. The decreasing gate-to-source capacitances may be used to compensate for the uneven capacitive coupling to the DA segments 16 caused by the decreasing capacitances used to compensate for the varying phase velocity along the second group 14 of inductive elements. In an exemplary embodiment of the DA 10, a ratio of a capacitance of each of the group of capacitive elements (FIG. 7) to a corresponding one of the gate-to-source capacitances $C_{GS1}$, $C_{GS2}$, $C_{GSM}$ is about equal to a first capacitance ratio, which remains about constant moving from the DA input DAINP to the first output FOUT. The output impedance of each of the tapered gate periphery common source transistor elements 42, 44, 46 may increase moving from the first input FINP to the DA output DAOUT to broaden an output power bandwidth of the DA 10.

Figure 9:
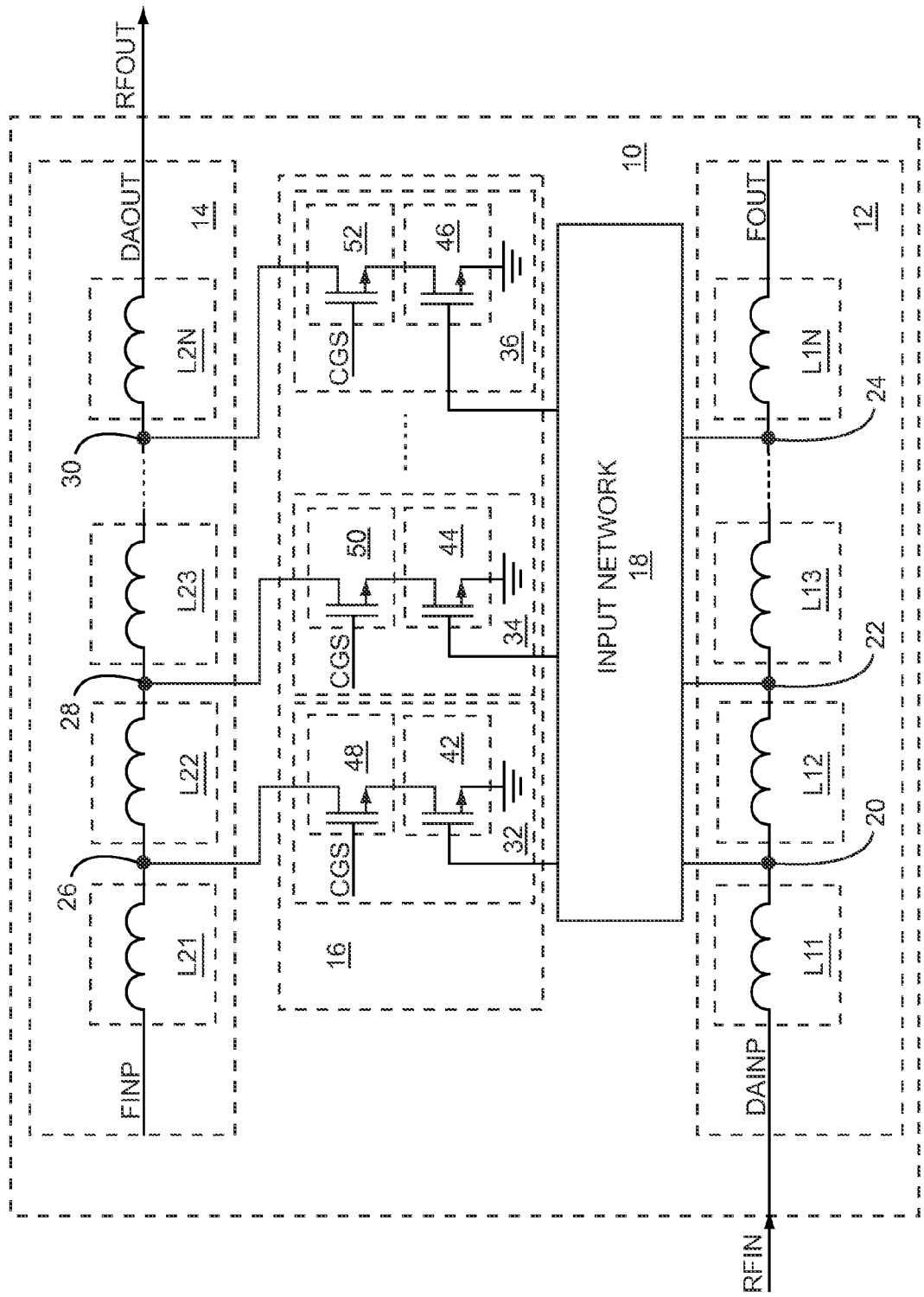
FIG. 9 shows details of the first, the second, and the $M^{TH}$ amplifier segments illustrated in FIG. 7 according to an alternate embodiment of the first, the second, and the $M^{TH}$ amplifier segments.

FIG. 9 shows details of the first, the second, and the $M^{TH}$ amplifier segments 32, 34, 36 illustrated in FIG. 7 according to an alternate embodiment of the first, the second, and the $M^{TH}$ amplifier segments 32, 34, 36. The first, the second, and the $M^{TH}$ amplifier segments 32, 34, 36 illustrated in FIG. 9 are cascode amplifier segments, such that each amplifier segment has two transistor elements coupled together in a cascode configuration. The first amplifier segment 32 includes the first common source transistor element 42, which is an input transistor element, and a first common gate transistor element 48, which is an output transistor element. The first common source transistor element 42 includes the first input gate FIG, the first input source, which is coupled to ground, and a first input drain. The first common gate transistor element 48 includes an output gate, which is coupled to a common gate DC supply CGS, the first output drain FOD, and an output source, which is coupled to the first input drain.

The second amplifier segment 34 includes the second common source transistor element 44, which is an input transistor element, and a second common gate transistor element 50, which is an output transistor element. The second common source transistor element 44 includes the second input gate SIG, the second input source, which is coupled to ground, and a second input drain. The second common gate transistor element 50 includes an output gate, which is coupled to the common gate DC supply CGS, the second output drain SOD, and an output source, which is coupled to the second input drain. The $M^{TH}$ amplifier segment 36 includes the $M^{TH}$ common source transistor element 46, which is an input transistor element, and an $M^{TH}$ common gate transistor element 52, which is an output transistor element. The $M^{TH}$ common source transistor element 46 includes the $M^{TH}$ input gate MIG, the $M^{TH}$ input source, which is coupled to ground, and an $M^{TH}$ input drain. The $M^{TH}$ common gate transistor element 52 includes an output gate, which is coupled to the common gate DC supply CGS, the $M^{TH}$ output drain MOD, and an output source, which is coupled to the $M^{TH}$ input drain.

The first common source transistor element 42 has the first gate-to-source capacitance $C_{GS1}$ between the first input gate FIG and the first input source. The second common source transistor element 44 has the second gate-to-source capacitance $C_{GS2}$ between the second input gate SIG and the second input source. The $M^{TH}$ common source transistor element 46 has the $M^{TH}$ gate-to-source capacitance $C_{GSM}$ between the $M^{TH}$ input gate MIG and the $M^{TH}$ input source.

As previously mentioned, in one embodiment of the DA 10, the second group 14 of inductive elements is non-uniformly distributed, such that the DA 10 is a capacitively-coupled NDA. An inductance of each of the second group 14 of inductive elements may decrease moving from the first input FINP to the DA output DAOUT to compensate for decreasing impedance along the second group 14 of inductive elements. As such, the capacitively-coupled NDA may have phase velocity variations along the second group 14 of inductive elements. To compensate for the phase velocity variations, a capacitance of each of the group of capacitive elements (FIG. 7) may decrease moving from the DA input DAINP to the first output FOUT to compensate for varying phase velocity along the second group 14 of inductive elements. Specifically, a capacitance of the second capacitive element C2 may be less than a capacitance of the first capacitive element C1. Each successive capacitive element may have a capacitance that is less than its predecessor down to the $M^{TH}$ capacitive element CM, which has a capacitance that is less than any preceding capacitances. However, the decreasing capacitances may cause uneven capacitive coupling to the DA segments 16. Uneven capacitive coupling may cause uneven division of input signals from the first group 12 of inductive elements to the DA segments 16.

In one embodiment of the DA segments 16, the common source transistor elements 42, 44, 46 are tapered gate periphery common source transistor elements, such that a gate periphery of each of the common source transistor elements 42, 44, 46 decreases moving from the DA input DAINP to the first output FOUT. The gate peripheries may be decreased by decreasing gate widths, decreasing gate lengths, or both.

The decreasing gate peripheries may decrease gate-to-source capacitances of the tapered gate periphery common source transistor elements 42, 44, 46. As such, the gate-to-source capacitance of each of the tapered gate periphery common source transistor elements 42, 44, 46 decreases moving from the DA input DAINP to the first output FOUT. Specifically, the second gate-to-source capacitance $C_{GS2}$ may be less than the first gate-to-source capacitance $C_{GS1}$. Each successive gate-to-source capacitance may be less than its predecessor down to the $M^{TH}$ gate-to-source capacitance $C_{GSM}$, which is less than any preceding capacitances. The decreasing gate-to-source capacitances may be used to compensate for the uneven capacitive coupling to the DA segments 16 caused by the decreasing capacitances used to compensate for the varying phase velocity along the second group 14 of inductive elements. In an exemplary embodiment of the DA 10, a ratio of a capacitance of each of the group of capacitive elements (FIG. 7) to a corresponding one of the gate-to-source capacitances $C_{GS1}$, $C_{GS2}$, $C_{GSM}$ is about equal to a first capacitance ratio, which remains about constant moving from the DA input DAINP to the first output FOUT.

In one embodiment of the DA segments 16, the common gate transistor elements 48, 50, 52 are tapered gate periphery common gate transistor elements, such that a gate periphery of each of the common gate transistor elements 48, 50, 52 decreases moving from the first input FINP to the DA output DAOUT. The gate peripheries may be decreased by decreasing gate widths, decreasing gate lengths, or both. The decreasing gate peripheries may increase output impedances of the tapered gate periphery common source transistor elements 48, 50, 52, such that the output impedance of each of the tapered gate periphery common gate transistor elements 48, 50, 52 increases moving from the first input FINP to the DA output DAOUT to broaden an output power bandwidth of the DA 10.

Figure 10:
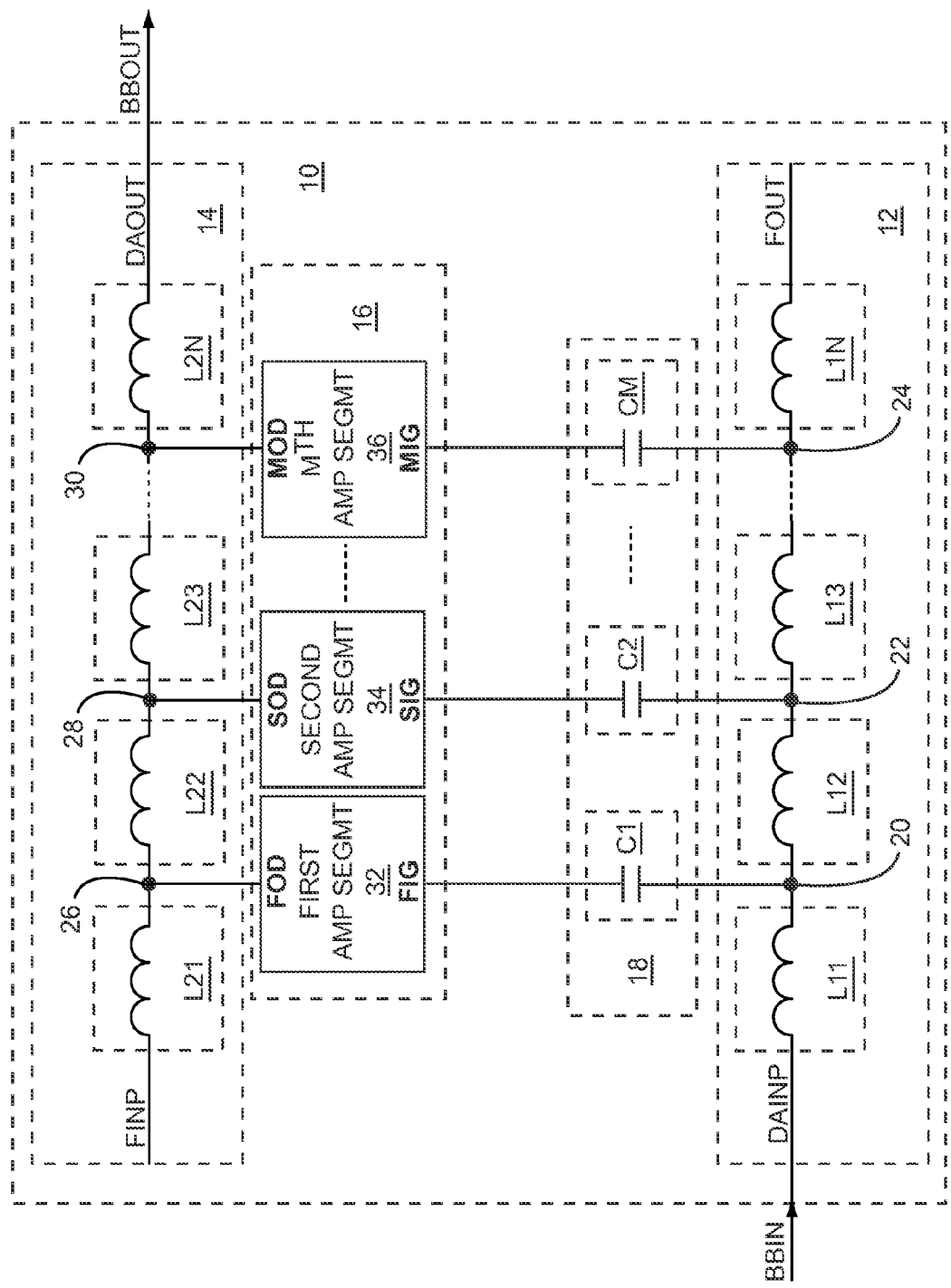
FIG. 10 shows the DA according to an additional embodiment of the DA.

FIG. 10 shows the DA 10 according to an additional embodiment of the DA 10. The DA 10 illustrated in FIG. 10 is similar to the DA 10 illustrated in FIG. 1 except in the DA 10 illustrated in FIG. 10, a baseband input signal BBIN feeds the DA input DAINP and the DA output DAOUT provides a baseband output signal BBOUT based on amplifying the baseband input signal BBIN. In another embodiment of the DA 10, in a first mode, the DA 10 receives and amplifies the RF input signal RFIN, and in a second mode, the DA 10 receives and amplifies the baseband input signal BBIN. In an exemplary embodiment of the DA 10, a frequency of the baseband input signal BBIN is less than about 10 megahertz and a frequency of the RF input signal RFIN is greater than about 100 megahertz.

Figure 11:
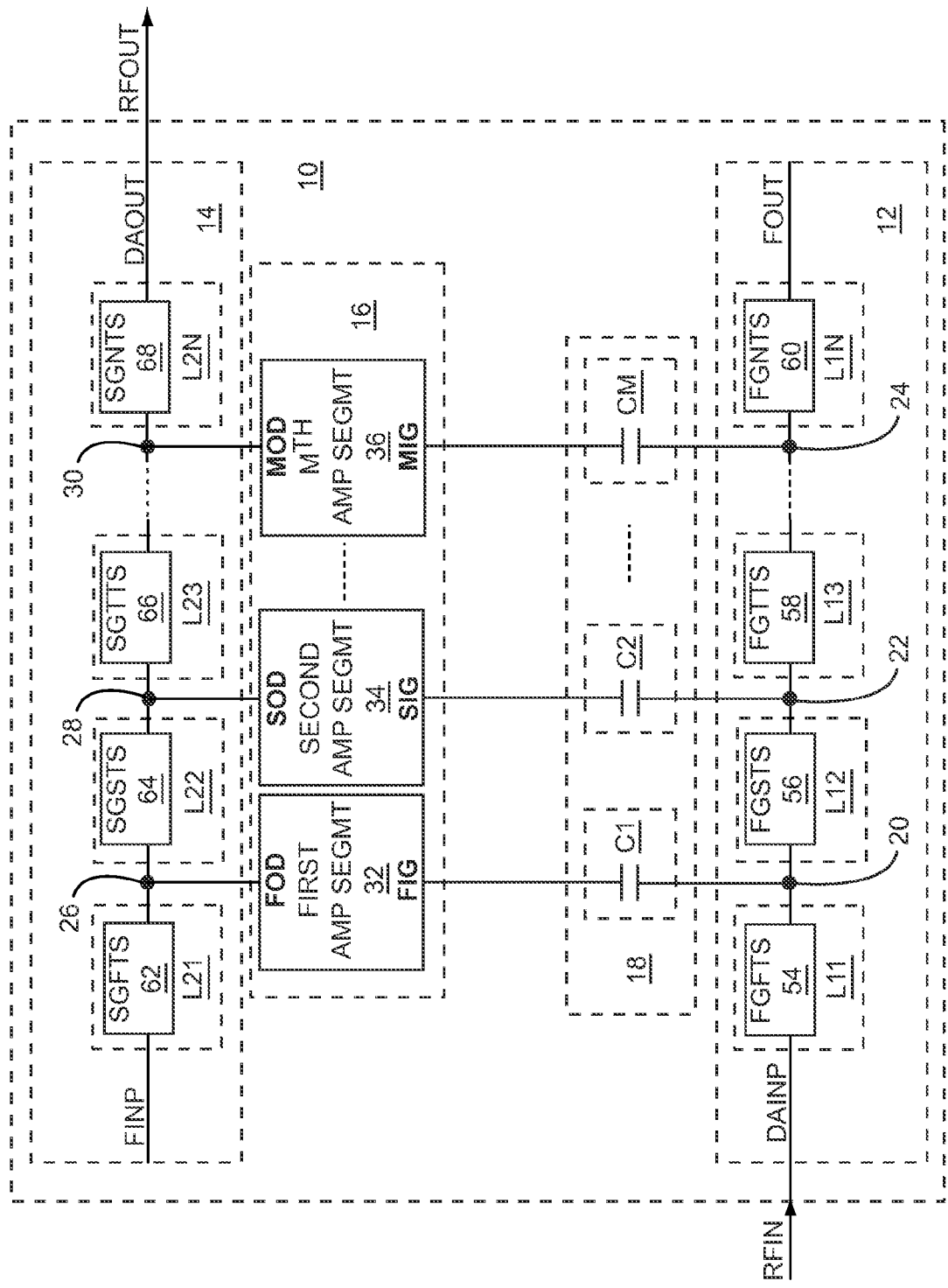
FIG. 11 shows details of the first group of inductive elements and the second group of inductive elements illustrated in FIG. 1 according to an additional embodiment of the first group of inductive elements and the second group of inductive elements.

FIG. 11 shows details of the first group 12 of inductive elements and the second group 14 of inductive elements illustrated in FIG. 1 according to the additional embodiment of the first group 12 of inductive elements and the second group 14 of inductive elements. The first and the second groups 12, 14 of inductive elements illustrated in FIG. 11 are similar to the first and the second groups 12, 14 of inductive elements illustrated in FIG. 1 except each inductive element in the first and the second groups 12, 14 of inductive elements illustrated in FIG. 11 is a transmission line segment. Specifically, the first group first inductive element L11 includes a first group first transmission line segment 54, the first group second inductive element L12 includes a first group second transmission line segment 56, the first group third inductive element L13 includes a first group third transmission line segment 58, the first group $N^{TH}$ inductive element L1N includes a first group $N^{TH}$ transmission line segment 60, the second group first inductive element L21 includes a second group first transmission line segment 62, the second group second inductive element L22 includes a second group second transmission line segment 64, the second group third inductive element L23 includes a second group third transmission line segment 66, and the second group $N^{TH}$ inductive element L2N includes a second group $N^{TH}$ transmission line segment 68.

Figure 12A:
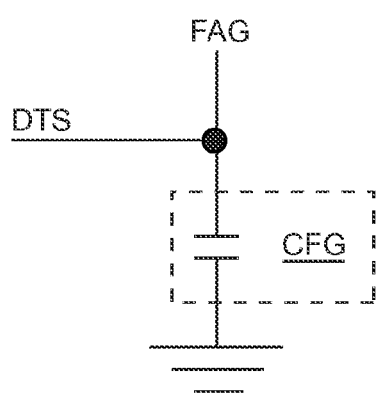
FIGS. 12A and 12B show circuitry associated with first and second alternating current (AC) grounds illustrated in FIG. 3 according to one embodiment of the first and the second AC grounds.
Figure 12B:
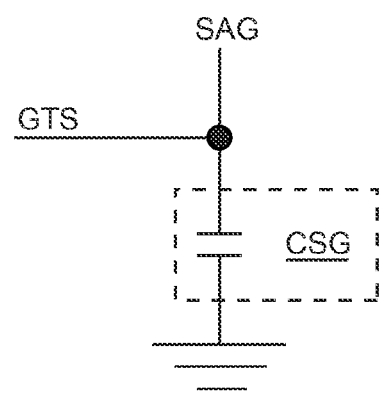

FIGS. 12A and 12B show circuitry associated with the first and the second AC grounds FAG, SAG illustrated in FIG. 3 according to one embodiment of the first and the second AC grounds FAG, SAG. A first ground capacitive element CFG is coupled between a drain termination DC supply DTS and ground to provide the first AC ground FAG using the drain termination DC supply DTS as shown in FIG. 12A. A second ground capacitive element CSG is coupled between a gate termination DC supply GTS and ground to provide the second AC ground SAG using the gate termination DC supply GTS as shown in FIG. 12B. In an exemplary embodiment of the DA 10, the drain termination DC supply DTS provides the gate termination DC supply GTS.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the preferred embodiments of the present disclosure. All such improvements and modifications are considered within the scope of the concepts disclosed herein and the claims that follow.

What is claimed is:

1. A distributed amplifier (DA) comprising:
a plurality of amplifier segments, such that each of the plurality of amplifier segments has an input gate and an output drain;
a first plurality of inductive elements coupled in series between a DA input and a first output to form a first plurality of connection nodes, such that each of the first plurality of connection nodes is coupled to a corresponding adjacent pair of the first plurality of inductive elements;
an input network, such that each of the first plurality of connection nodes is associated with a corresponding input gate of the plurality of amplifier segments; and
a second plurality of inductive elements coupled in series between a first input and a DA output to form a second plurality of connection nodes, such that each of the second plurality of connection nodes is coupled to a corresponding adjacent pair of the second plurality of inductive elements and to a corresponding output drain of the plurality of amplifier segments,
wherein respective ones of the first plurality of connection nodes are directly connected only to corresponding ones of the first plurality of inductive elements and the input network and respective ones of the second plurality of connection nodes are directly connected only to corresponding ones of the second plurality of inductive elements and the corresponding output drain;
wherein the DA input is adapted to receive a first input signal and the DA output is adapted to provide a first output signal based on amplifying the first input signal;
wherein the DA is a non-uniformly distributed amplifier (NDA), such that an inductance of each of the second plurality of inductive elements decreases moving from the first input to the DA output to compensate for decreasing impedance along the second plurality of inductive elements; and
wherein the input network comprises a plurality of capacitive elements associated with corresponding connection nodes and a capacitance of each of the plurality of capacitive elements decreases moving from the DA input to the first output to compensate for varying phase velocity along the second plurality of inductive elements.

2. The DA of claim 1 wherein the plurality of amplifier segments comprises a plurality of tapered gate periphery transconductance devices, such that:
each of the plurality of tapered gate periphery transconductance devices comprises the input gate and an input source and has a gate-to-source capacitance between the input gate and the input source; and
the gate-to-source capacitance of each of the plurality of tapered gate periphery transconductance devices decreases moving from the DA input to the first output.

3. The DA of claim 2 wherein a ratio of the capacitance of each of the plurality of capacitive elements to a corresponding gate-to-source capacitance of each of the plurality of tapered gate periphery transconductance devices is about equal to a first capacitance ratio.

4. The DA of claim 2 wherein an output impedance of each of the plurality of tapered gate periphery transconductance devices increases moving from the first input to the DA output to broaden an output power bandwidth of the NDA.

5. The DA of claim 1 wherein the plurality of amplifier segments comprises a plurality of tapered gate periphery transconductance devices, such that an output impedance of each of the plurality of tapered gate periphery transconductance devices increases moving from the first input to the DA output to broaden an output power bandwidth of the NDA.

6. The DA of claim 1 wherein:
the first input signal is a baseband signal;
the first output signal is an amplified baseband signal; and
the DA input is further adapted to receive a radio frequency (RF) input signal and the DA output is further adapted to provide an RF output signal based on amplifying the RF input signal.

7. The DA of claim 6 wherein a frequency of the first input signal is less than about 10 megahertz and a frequency of the RF input signal is greater than about 100 megahertz.

8. The DA of claim 1 further comprising a drain termination load network coupled to the first input.

9. A distributed amplifier (DA) comprising:
an input line comprising:
a DA input;
a first output;
a first plurality of inductive elements coupled in series between the DA input and the first output; and
a plurality of first connection nodes such that each of the first connection nodes is coupled to a corresponding adjacent pair of the first plurality of inductive elements;
an output line comprising:
a first input;
a DA output;
a second plurality of inductive elements coupled in series between the first input and the DA output; and
a plurality of second connection nodes such that each of the second connection nodes is coupled to a corresponding adjacent pair of the second plurality of inductive elements;

an input network comprising a plurality of capacitive elements coupled to respective ones of the plurality of first connection nodes;

a plurality of amplifier segments, such that each of the plurality of amplifier segments has an input gate and an output drain, each of the plurality of amplifier segments coupled to the input network through a respective input gate and coupled to respective ones of the plurality of second connection nodes through a respective output drain;

wherein the input line is coupled to the output line only through the input network and the plurality of amplifier segments and optionally through a ground; and wherein the DA is a non-uniformly distributed amplifier (NDA), such that an inductive of each of the second plurality of inductive elements decreases moving from the first input to the DA output to compensate for decreasing impedance along the second plurality of inductive elements; and wherein the input network further comprises a plurality of resistive elements, each resistive element coupled with a respective one of the capacitive elements.

10. The DA of claim 9 further comprising:

a drain termination load coupled to the output line; and a gate termination load coupled to the input line.

11. The DA of claim 10 wherein the drain termination load is further coupled to ground and the gate termination load is further coupled to ground.

12. The DA of claim 9 wherein a capacitance of each of the plurality of capacitive elements decreases moving from the DA input to the first output to compensate for varying phase velocity along the second plurality of inductive elements.

13. The DA of claim 9 wherein the plurality of amplifier segments comprise Gallium Nitride.

* * * * *